United States Patent [19]

Kohsiek

[11] Patent Number: 4,607,238

[45] Date of Patent: Aug. 19, 1986

[54] MONOLITHIC INTEGRATED RC-OSCILLATOR

[75] Inventor: Cord H. Kohsiek, Ellerau, Fed. Rep. of Germany

[73] Assignee: U.S. Philips Corporation, New York, N.Y.

[21] Appl. No.: 681,472

[22] Filed: Dec. 13, 1984

[30] Foreign Application Priority Data

Dec. 19, 1983 [DE] Fed. Rep. of Germany ....... 3345852

[51] Int. Cl.$^4$ .............................................. H03K 3/02
[52] U.S. Cl. ................................ 331/143; 331/108 D; 331/111
[58] Field of Search .................. 331/108 D, 111, 143, 331/150; 307/260; 328/67, 68

[56] References Cited

U.S. PATENT DOCUMENTS 4,413,238 11/1983 Pace .................................... 331/111
4,531,237 7/1985 Bar-on et al. ................... 331/111 X

FOREIGN PATENT DOCUMENTS 0847490 7/1981 U.S.S.R. ............................ 331/111

Primary Examiner—Eugene R. LaRoche
Assistant Examiner—Robert J. Pascal
Attorney, Agent, or Firm—Robert T. Mayer; Steven R. Biren

[57] ABSTRACT

In a monolithic integrated RC-oscillator comprising only one external frequency-determining network of a capacitance and a discharge circuit, a charging circuit which can be switched on and off periodically is connected to the network, which charging circuit is switched on and switched off by means of a threshold circuit with two switching thresholds when the voltage across the capacitor of the network reaches the lower and the upper switching threshold, respectively. In order to ensure that the frequency of the generated sawtooth signal is independent of a fixed discharge current, which is subject to spreading, and of the temperature coefficient of this current, the charging current of the charging circuit is controlled by the voltage across a second capacitor, which is charged or discharged with a current ($I_1$) when the frequency-determining capacitance is discharged and which is discharged or charged with a second current when said frequency-determining capacitor is charged.

5 Claims, 4 Drawing Figures

MONOLITHIC INTEGRATED RC-OSCILLATOR

BACKGROUND OF THE INVENTION

The invention relates to a monolithic integrated RC-oscillator comprising only one external network which comprises a capacitor and a discharge circuit and which is arranged between a terminal of the integrated circuit and a point of reference potential, a charging circuit which can be switched on and off periodically being connected to said network, and said terminal being connected to a threshold circuit which has two switching thresholds and which causes the charging circuit to be switched on and switched off when the voltage across the capacitor of the network reaches the lower and the upper switching threshold, respectively.

An oscillator of this type is described in DE-OS No. 19 21 035. Oscillators of this type in the form of integrated circuits are frequently employed for generating a sawtooth voltage. Since the external frequency-determining elements are connected to only one terminal of the integrated circuit, oscillators of this type are also referred to as "1-pin oscillators". In such an oscillator the external discharge circuit generally comprises a resistor arranged in parallel with the capacitor. One edge (time interval $T_2$) of the sawtooth waveform generated by such an oscillator is determined by the values of the external resistor and the external capacitor and the other edge (time interval $T_1$) is also determined by the values of these two elements and by a charging current generated in the integrated circuit. In order to minimize the influence of the inevitable spread in the value of the charging current on the oscillator frequency, $T_2$ is selected to be substantially longer than $T_1$.

This has the disadvantage that the charging current during time interval $T_1$ is larger, which may give rise to various problems (surge loading of the power supply, high current loads of the components, radio interference).

SUMMARY OF THE INVENTION

It is the object of the invention to construct an oscillator of the type defined in the opening paragraph in such a way that the time interval $T_1$ (first edge of the sawtooth) no longer depends on a fixed charging current whose value is subject to spreading and on the temperature coefficient of this current.

According to the invention this object is achieved in that in an oscillator of the type defined above the charging current of the charging circuit is controlled by the voltage across a second capacitor which is charged or discharged with a current ($I_1$) when the frequency-determining capacitor is discharged and which is discharged or charged with a current ($I_2$) when the said frequency-determining capacitor is charged. This has the advantage that the time interval $T_1$ only depends on the time interval $T_2$ and is no longer dependent on the dimensioning of the current source. Therefore, $T_2$ is no longer required to be substantially longer than $T_1$. In this way the aforementioned disadvantages (surge loading of the current supply, high current loads of the components etc.) are eliminated and the attainable frequency accuracy is higher.

BRIEF DESCRIPTION OF THE DRAWING

An embodiment of the invention will now be described in more detail, by way of example, with reference to the accompanying drawing.

In the drawing.

DESCRIPTION OF THE PREFERRED EMBODIMENT

Figure 1:
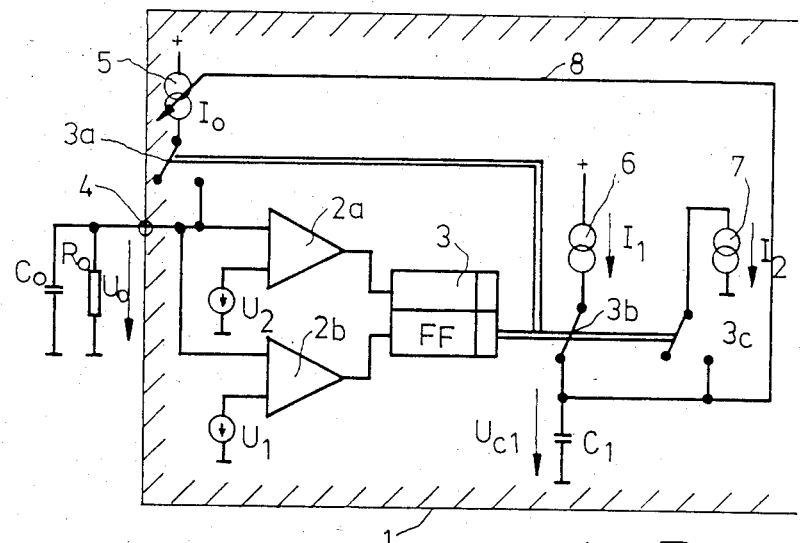
FIG. 1 shows the circuit diagram of a monolithic integrated RC-oscillator in accordance with the invention.

FIG. 1 shows schematically the circuit diagram of a monolithic integrated RC-oscillator in accordance with the invention. All the relevant integrated-circuit elements are shown inside the frame 1 which represents the boundaries of the chip. Only the frequency-determining network, which in the present case comprises the parallel arrangement of a capacitor $C_0$ and a resistor $R_0$, is external to the integrated circuit and is connected between reference potential (in the present case ground) and an input 4 of the integrated circuit. Inside the integrated circuit a charging circuit is connected to this input 4, which charging circuit comprises a current source 5 which is periodically connectable via a switch 3a. Further, a threshold circuit is connected to this input 4, which threshold circuit comprises two comparators 2a and 2b which control a flip-flop 3. The switching thresholds of the threshold circuit 2a, 2b, 3 are determined by the voltages $U_1$ and $U_2$ applied to the two comparators. The charging current $I_0$ from the current source 5 is switched on and off by the flip-flop 3 via the switch 3a, which is shown symbolically.

The circuit arrangement described so far operates as follows. The external capacitor $C_0$, which is arranged in parallel with the resistor $R_0$, is charged by the current source 5 until the voltage $U_0$ across the external capacitor has reached the value $U_2$. The comparator 2a then sets the flip-flop 3, which switches off the current $I_0$, via the switch 3a.

The capacitor $C_0$ is then discharged via the parallel resistor $R_0$ until the voltage $U_0$ across the capacitor has reached the value $U_1$ and the comparator 2b resets the flip-flop 3, which switches on the current source 5 again.

The operation of the oscillator described so far corresponds to that of the known oscillators. However, in addition to the current source 5, the oscillator in accordance with the invention shown here comprises two further current sources 6 and 7 which are switched on and off alternately and which charge and discharge respectively a further capacitance $C_1$ with a current $I_1$ and $I_2$ respectively, depending on the state of the flip-flop 3. The value of the current $I_0$ generated by the current source 5 is now controlled by the voltage $U_{C1}$ across the further capacitor $C_1$ via the connection 8. The charging time of the external capacitor $C_0$ varies with the value of $I_0$. The control loop thus formed defines a ratio between the charging time $T_1$ and the discharging time $T_2$ of the external capacitor $C_0$, which ratio corresponds to the ratio between $I_1$ and $I_2$, because during the steady-state operation the charge $Q_1$ formed on $C_1$ and the charge $Q_2$ removed from $C_1$ must be equal within one period.

Therefore: $Q_1 = I_1 \times T_1$, $Q_2 = I_2 \times T_2$ from $Q_1 = Q_2$ it follows that $T_1/T_2 = I_2/I_1$ or $T_1 = T_2 (I_2/I_1)$.

The ratio between the currents $I_1$ and $I_2$ can be defined accurately, so that the charging time $T_1$ is dictated only by the discharge time $T_2$ which depends on $R_0$ and $C_0$. Moreover, the ratio between the currents $I_1$ and $I_2$ is substantially temperature-independent.

A possible non-linearity of the further capacitor $C_1$ will not influence the oscillator frequency, because the charging and the discharging of $C_1$ are influenced to the same extent by the non-linearity. This means that the further capacitor $C_1$ may simply be an integrated capacitor, for example a junction capacitance.

Figure 2A:
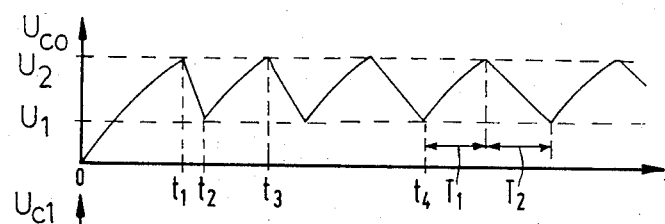
FIGS. 2a to c show voltage and current waveforms appearing in the oscillator shown in FIG. 1.
Figure 2B:
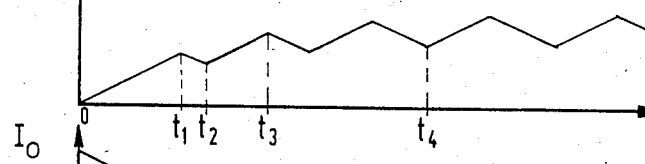
Figure 2C:
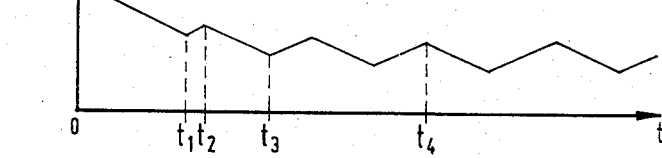

The slope $I_0/U_{C1}$ of the controlled current source does not influence the oscillator frequency, because, as already stated, the charging times $T_1$ and $T_2$ depend only on $R_0$ and $C_0$. FIGS. 2a to 2c show the voltage and current waveforms appearing after switching on when $I_1 = I_2$ in the case that capacitor $C_1$ is also charged during charging of capacitor $C_0$.

FIG. 2a shows the voltage across the external capacitor $C_0$. FIG. 2b shows the voltage across the further capacitor $C_1$ and FIG. 2c shows the charging current $I_0$ supplied by the current source 5.

Immediately after switching on ($t=0$) capacitor $C_0$ is charged by a large current ($I_0$). Since at the same time capacitor $C_1$ is charged with a current $I_1$, the voltage $U_{C1}$ across this capacitor increases, so that the current $I_0$ is reduced via the connection 8. When the voltage across the capacitor $C_0$ reaches the value $U_2$ ($t=t_1$) the threshold circuit causes the charging currents $I_0$ and $I_1$ to be switched off and the discharge current $I_2$ of capacitor $C_1$ to be switched on, so that the voltage $U_{C1}$ across capacitor $C_1$ decreases. Via resistor $R_0$ capacitor $C_0$ is discharged, so that the voltage across it decreases until it reaches the value $U_1$ ($t=t_2$) and the charging currents $I_0$ and $I_1$ are switched on again. In the time interval $t_1 - t_2$ capacitor $C_1$ is not discharged entirely by the discharge current $I_2$. As a result of this, the voltage $U_{C1}$ increases again and the current $I_0$ decreases further. In this way the current $I_0$ is controlled until ($t=t_4$) the condition is reached in which the current $I_1$ charges the capacitor $C_1$ to the same extent as it is discharged by the current $I_2$. In this situation the ratio between the rise and fall times $T_1/T_2$ of the sawtooth voltage depends only on the ratio between the discharge current and the charging current ($I_2/I_1$).

Instead of charging or discharging the capacitor $C_1$ during charging and discharging of the capacitor $C_0$, it is alternatively possible to charge or discharge the capacitor $C_1$ while the capacitor $C_0$ is discharged or charged. The current source 5 should then be controlled in such a way that if the voltage $U_{C1}$ across capacitor $C_1$ decreases the output current $I_0$ decreases.

What is claimed is:

1. A monolithic integrated RC-oscillator, comprising a single external network which comprises a first capacitor and a discharge circuit and which is arranged between a terminal of the integrated circuit and a point of reference potential, a threshold circuit having two switching thresholds, a charging circuit, which can be switched on and off periodically, connected to said network and said terminal being connected to said threshold circuit which has an upper and a lower switching threshold and which causes the charging circuit to be switched on and switched off during operation when the voltage across the first capacitor of the network reaches the lower and the upper switching threshold, respectively, a second internal capacitor coupled to said charging circuit, the charging current of the charging circuit being controlled by the voltage across said second capacitor, which has its charge altered in a first sense with a first current when the first capacitance is discharged and which has its charge altered in a second, opposite sense with a second current when said first capacitance is charged.

2. An RC-oscillator as claimed in claim 1, characterized in that the first and second currents are adjustable.

3. An RC-oscillator as claimed in claim 1 or 2, characterized in that the second capacitor is integrated.

4. An RC-oscillator as claimed in claim 1, characterized in that the discharge circuit comprises a resistor which is arranged in parallel with the first capacitor.

5. A monolithic integrated RC-oscillator comprising an external terminal for the connection of a network which is arranged between this terminal and a point of reference potential, which network comprises a first capacitor and a discharge circuit, a threshold circuit having two switching thresholds, a charging circuit, which can be switched on and off periodically, connected to said network, and said terminal being connected to said threshold circuit which has an upper and a lower switching threshold and which causes the charging circuit to be switched on and switched off during operation when the voltage across the first capacitor of the network reaches the lower and the upper switching threshold, respectively, a second, internal capacitor coupled to said charging circuit, the charging current of the charging circuit being controlled by the voltage across said second capacitor which has its charge altered in a first sense with a first current when the first capacitance is discharged and which has its charge altered in a second, opposite sense with a second current when said first capacitance is charged.

* * * * *

UNITED STATES PATENT AND TRADEMARK OFFICE
CERTIFICATE OF CORRECTION

PATENT NO. : 4,607,238

DATED : August 19, 1986

INVENTOR(S) : Cord H. Kohsiek

It is certified that error appears in the above-identified patent and that said Letters Patent is hereby corrected as shown below:

In the abstract line 16, after "with a" insert -- first --;
line 16, "($I_1$)" should be deleted.

Signed and Sealed this

Ninth Day of December, 1986

Attest:

DONALD J. QUIGG

Attesting Officer

Commissioner of Patents and Trademarks